United States Patent [19]

Wong et al.

[11] Patent Number: 5,418,482
[45] Date of Patent: May 23, 1995

[54] HIGH-SPEED SENSE AMPLIFIER WITH REGULATED FEEDBACK

[75] Inventors: Jack T. Wong, Fremont; Fabiano Fontana, Santa Clara; Martha Chan, Cupertino,, all of Calif.

[73] Assignee: Advanced Micro Devices, Inc., Sunnyvale, Calif.

[21] Appl. No.: 138,532

[22] Filed: Oct. 15, 1993

[51] Int. Cl.[6] .......................... H03F 3/18; H03K 17/04
[52] U.S. Cl. ........................... 327/51; 327/374; 327/378
[58] Field of Search ........... 365/203, 207, 208, 189.08, 365/189.11; 327/51, 378, 374; 307/530, 538, 544, 546, 443

[56] References Cited

U.S. PATENT DOCUMENTS

| | | | |
|---|---|---|---|
| 4,348,601 | 9/1982 | Kitamura | 307/530 |
| 4,972,102 | 11/1990 | Reis et al. | 307/530 |
| 4,982,363 | 1/1991 | Sood | 307/530 |
| 5,117,124 | 5/1992 | Dicke | 307/530 |
| 5,175,450 | 12/1992 | Chern | 307/530 |
| 5,341,333 | 8/1994 | Tien et al. | 307/530 |

Primary Examiner—Timothy P. Callahan
Assistant Examiner—My-Trang Nu Ton
Attorney, Agent, or Firm—Raymond Kam-On Kwong; Joseph A. Sawyer, Jr.; Judy M. Maher

[57] ABSTRACT

A sense amplifier is provided that has improved speed from input to output, particularly during low-to-high transitions on the output and minimizes power consumption. By removing the product term window circuit from the critical node, the overall speed of the amplifier is maximized. In addition, circuitry is included to speed up low-to-high transitions, high-to-low transitions and provide increased noise immunity over temperature variations.

22 Claims, 10 Drawing Sheets

HIGH-SPEED SENSE AMPLIFIER WITH REGULATED FEEDBACK

FIELD OF THE INVENTION

This invention relates generally to semiconductor integrated circuits and more particularly, it relates to an improved sense amplifier circuit for use in very high-speed sensing applications.

BACKGROUND OF THE INVENTION

Sense amplifiers are widely used to amplify output signals of memory circuits. FIG. 1 shows a diagram of a typical device using a sense amplifier 8. Circuit 16 may be a memory cell, a combination of memory cells whose outputs are 'ANDed' (say, a PLD), or some other device which has a product term ("PT") output 12 and a product term ground ("PTG") output 14. PT 12 can be high, for example 2.2 V, or low, for example 1.6 V. Sense amplifier 8 includes a p-channel pull-up transistor 34 and an n-channel pull-down transistor 36. Pull-up transistor 34 has a source 61 connected to a positive voltage supply VDD and a gate 51 connected to a voltage supply VREFP. Pull-down transistor 36 has a gate 31 connected to a constant voltage supply (not shown). Transistors 34 and 36 are always on. Circuit 16 can act as a switch to connect PT 12 to PTG 14 or to disconnect them from each other. When circuit 16 disconnects PT 12 from PTG 14, PT 12 is kept high by the voltage supply VDD through pull-up transistor 34. When circuit 16 connects PT 12 to PTG 14, PT 12 is driven low by the current through pull-down transistor 36.

PT 12 is amplified by buffer 18 whose output 120 can be high, for example 5 V, or low, for example 0 V.

FIG. 2 shows a prior art device with sense amplifier 8 in greater detail. Circuit 16 is an n-channel transistor which either connects PT 12 to PTG 14 or disconnects them from each other depending on the voltage on its gate 69. PT 12 is connected to buffer 18 through an n-channel pass transistor 66. Buffer 18 includes inverters 5 and 6. Inverter 6 includes a p-channel transistor 58 whose source 11 is connected to a constant positive voltage supply (not shown), and an n-channel transistor 60 whose source is connected to the ground. Buffer 18 also includes an n-channel feedback transistor 62 and a p-channel feedback transistor 64. Drain 21 of feedback transistor 62 is connected to a positive voltage supply (not shown). Feedback transistors 62 and 64 stabilize the voltage at node 19. When the voltage on node 19 goes too high, node 17 connected to the gates of feedback transistors 62 and 64 goes too low. As a result, the current through transistor 62 goes down, and the current through transistor 64 goes up. This pulls the voltage at node 19 down until the voltage at node 19 reaches its normal value. When the voltage at node 19 becomes too low, the voltage at node 17 is pulled up high. As a result, the current through feedback transistor 64 goes down, and the current through feedback transistor 62 goes up. This pulls the voltage at node 19 up to its normal value.

FIG. 3 shows another circuit with a sense amplifier. Buffer 18 includes inverters 3 and 4. Inverter 3 includes a p-channel transistor 44 and an n-channel transistor 46. Inverter 4 includes a p-channel transistor 40 and an n-channel transistor 42. Buffer 18 further includes an n-channel feedback transistor 50 and n-channel feedback transistor 48.

FIG. 4 shows another device using a sense amplifier. Here circuit 16 includes an EEPROM cell 10 and a transistor 24 whose gate is connected to a row line. PT 12 is connected to the gate of pull-down transistor 36. PTG 14 is connected through pull-down transistor 36 to the drain of another pull-down transistor 28. The source of transistor 28 is connected to the ground. The gate of transistor 28 is connected to a positive voltage supply (not shown). The gate of clamp transistor 26 is connected to PT 12 through pass transistor 66. Buffer 18 comprises inverters 20 and 22. Inverter 20 comprises a p-channel transistor 39 and an n-channel transistor 38. VREFP is generated by voltage divider 57 of which VDD is an input. As a result, VREFP tracks VDD; when VDD increases, so does VREFP.

FIG. 5 diagrams PT 12 and output 120. When PT 12 rises from the low level VIL of 1.6 V to the high level VIH of 2.2 V as shown in FIG. 5(a), output 120 rises from 0 V to 5.0 V. The steeper is the rising edge 70 of PT 12, the steeper is the rising edge 71 of output 120 and so the faster is the sense amplifier on low-to-high transitions. When PT 12 falls from high to low as shown in FIG. 5(b), output 120 falls also. The steeper is the falling edge 75 of PT 12, the steeper is the falling edge 76 of output 120 and so the faster is the sense amplifier on high-to-low transitions.

It is desirable to provide a faster sense amplifier, and so it is desirable to provide steeper edges 71 and 76. It is also desirable to reduce the power consumption of a sense amplifier.

When the voltage on PT 12 changes between its low value VIL, say, 1.6 V, and its high value VIH, say, 2.2 V, buffer 18 switches output 120 at some intermediate input threshold voltage VTH, say 1.9 V. The relationship between VIL, VIH and VTH is shown in FIG. 6. The difference ("noise margin") 23 between VIH and VTH determines the tolerance of sense amplifier 8 to noise when PT is high. The difference ("noise margin") 33 between VTH and VIL determines the tolerance of sense amplifier 8 to noise when PT 12 is low. As shown in FIG. 6(a), voltage VTH is usually near the middle between VIL and VIH, so that the noise margins 23 and 33 are about equal.

At low operating temperatures, say at 0 degrees C., the threshold voltage VTH decreases. See FIG. 6(b). Another factor that can decrease voltage VTH is an increase, even by 5%, in voltage VDD on the source of pull-up transistor 34. When voltage VTH decreases, noise margin 33 between VTH and VIL also decreases. As a result, the sense amplifier becomes less reliable because it becomes more sensitive to noise on PT 12 when PT 12 is low. To keep noise margin 33 wide, sense amplifiers are made to that the total difference ("window") 43 between VIH and VIL is large.

This can be achieved, for example, by enlarging the transistors in the sense amplifier. Yet increasing window 43 between voltages VIH and VIL makes the device using the sense amplifier slower, because it takes longer to switch between voltages VIH and VIL which are far apart. It is desirable to provide a sense amplifier that is fast and reliable both in normal conditions and at low temperatures and high VDD voltage supplies. It is desirable in general to decrease the noise sensitivity in a sense amplifier.

Some sense amplifiers use feedback circuitry to stabilize voltages. Transistors 62 and 64 in FIG. 2 form such a circuit. Yet many feedback circuits have only a limited application because they are intolerant to process variations. Feedback circuits usually include both p-channel and n-channel transistors manufactured during different process steps. The ratio between the p- and n-channels is crucial for the correct operation of the feedback circuit. If, due to process variations, p-channels are too large, many feedback circuits are unreliable. It is desirable to provide a sense amplifier more tolerant to process variations.

Circuit 16 may be a combination of memory cells whose outputs are 'ANDed' together. Circuit 16 of FIG. 7 has EEPROM memory cells like cell 53. Each cell is connected to PT 12 through a transistor like transistor 63. If all memory cells like cell 53 are programmed to conduct, and row line 45 is high, PT 12 is driven very low, possibly below 1.6 V. As a result, the transition of PT 12 from low to high (when row line 45 goes from high to low) is especially slow. A similar problem occurs on high-to-low transitions if only one of the memory cells is programmed to conduct. In that case, when row line 45 changes from low to high, PT 12 is driven from high to low by only one conducting memory cell. This transition is quite slow. It is desirable to provide a sense amplifier which provides fast transitions of output 120 when circuit 16 is a combination of memory cells of FIG. 7.

An improved sense amplifier is disclosed in U.S. Pat. No. 5,189,322, entitled LOW-POWER SENSE AMPLIFIER WITH FEEDBACK, assigned to the assignee of the present application. Although this invention works effectively for its intended purpose in providing a sense amplifier having an increase in signal transition speed in a power-efficient manner, however, for some current high-speed integrated circuit applications, further improvement in signal transition speed is required.

Accordingly, there is a long-felt but unsatisfied need to have an improved sense amplifier that has improved speed performance while at the same time not increasing power consumption. The circuit should be easily manufactured utilizing existing technology while at the same time being a cost effective alternative to known circuits. The present invention addresses such a need.

SUMMARY OF THE INVENTION

A sensing apparatus for receiving an input signal and for providing an output signal, which is CMOS compatible, at an output terminal is disclosed. The sensing apparatus includes a plurality of critical nodes, a product term window means responsive to the input signal for providing a predetermined voltage window, and an inverter coupled to the product term window means so that the product term window means is not connected to any critical nodes of the sensing apparatus for speeding up the low-to-high and high-to-low transitions of the output signal.

In a first aspect, sensing apparatus further includes first logic means coupled between the output and a first critical node for speeding up the low-to-high transitions on the output.

In another aspect, the sensing apparatus includes second logic means coupled between the output and a second critical node for speeding up the low-to-high transitions on the output.

In yet another aspect, the sensing apparatus includes compensation means coupled to the second logic means for compensating for temperature variations to improve noise immunity and minimize power consumption when the output is at the low logic level.

The sense amplifier of the present invention has improved speed performance while consuming an equivalent amount of power compared to prior art sense amplifiers.

DETAILED DESCRIPTION OF THE DRAWINGS

This invention relates to an improvement in a sense amplifier in an integrated circuit. The following description is presented to enable one of ordinary skill in the art to make and use the invention as provided in the context of a particular application and its requirements. Various modifications to the preferred embodiment will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

The performance objectives for an amplifier used in a digital circuit (i.e. a sense amplifier) are: minimize propagation delay from input to output; minimize power consumption; maximize noise margin; minimize temperature sensitivity; and minimize sensitivity to process variations. Changes improving performance with respect to one objective often degrade performance with respect to another (e.g. a change which reduces propagation delay will generally either increase power consumption or reduce noise margin or both). An optimum design then is one which balances the above performance objectives.

The primary objective for the sense amplifier of the present invention is to minimize the propagation delay from input to the circuit to output (i.e. maximize the speed), while maintaining power consumption at a reasonable level as compared to prior art examples. The speed is gained without degrading noise margins and in fact, noise margin is actually improved during certain regions of operation where added noise margin is good (i.e. at high VDD and 0° C. where the circuit generates the most noise). Temperature sensitivity is also improved through this design while sensitivity to process variation is not degraded.

A digital amplifier has two states—high and low—and deals with two types of transitions—high to low and low to high. The basic design of this sense amplifier works very much like many previous sense amplifier designs in that it reads and interprets a very small voltage swing at the input and translates this into a full CMOS swing at its output. This is almost by definition what a digital CMOS sense amplifier does.

Figure 8:
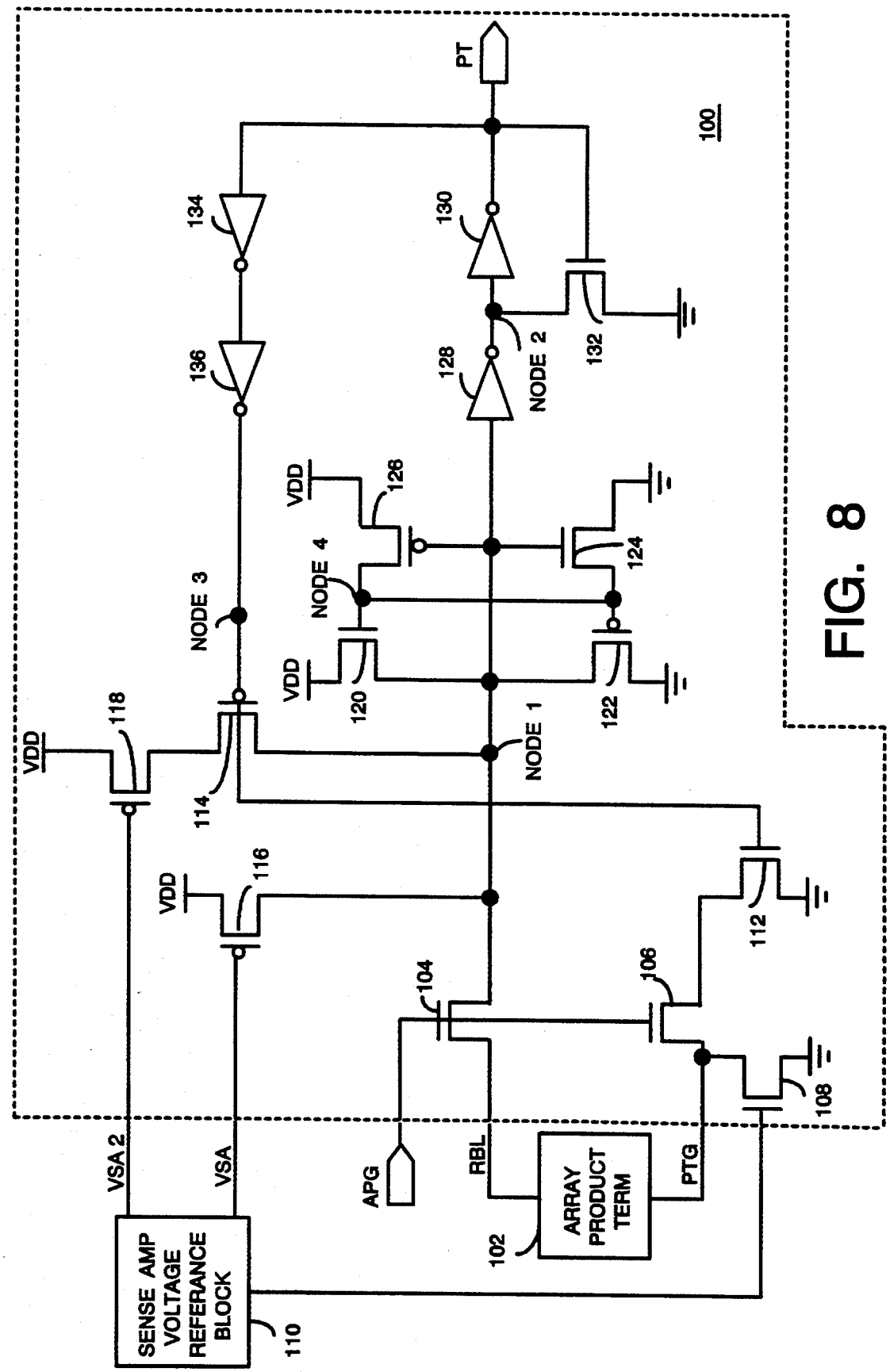
FIG. 8 is a diagram of a sense amplifier in accordance with the present invention.

Referring now to FIG. 8 what is shown is a sense amplifier 100 in accordance with the present invention. The circuit 100 includes an array product term block 102. The array product term block provides the RBL output to the source of transistor 104 and the product term ground (PTG) output to the source of transistor 106 and to the drain of transistor 108. The gate of transistor 108 is couple to the Vbias output of sense voltage reference block. The source of transistor 108 is coupled to Vss. An APG input is coupled to the gates of transistors 106 and 104. The drain of transistor 106 is coupled the drain of transistor 112. The source of transistor 112 is coupled to Vss. The gate of transistor 112 is coupled to the gate of transistor 114.

The drain of transistor 104 is coupled to the drain of transistor 116. The gate of p-channel transistor 116 is coupled to a reference, voltage source (VSA) from the voltage reference block 110. The source of transistor 116 is coupled to VDD. A second reference voltage source (VSA2) from block 110 is provided to the gate of p-channel transistor 118. The source of transistor 118 is coupled to VDD and the drain of transistor 118 is coupled to the source of transistor 114. The drain of transistor 114 is coupled to node 1 along with the drain transistor 116, the drain of transistor 104, the source of n-channel transistor 120, the source of p-channel transistor 122 and the gates of transistors 124 and 126. The drain of transistor 120 is coupled to VDD. The drain of transistor 122 is coupled to Vss. The gates of transistors 120 and 122, the drain of transistor 124 and the drain of transistor 126 are coupled together at node4. The source of transistor 126 is coupled to VDD. The source of transistor 124 is coupled to Vss.

Node1 is also coupled to the input of inverter 128. The output of the inverter 128 is coupled to node2 and the input of inverter 130. The output of inverter 130 is coupled to the gate of a p-channel transistor 132. The source of the transistor 132 is coupled to node2 and its drain is coupled to Vss. The output of inverter 130 is also coupled to the input of the inverter 134. The output of the inverter 134 is in turn coupled to the input of the inverter 136. The output of the inverter 136 is coupled to the gate of the transistor 114.

Basic operation of circuit 100:

When a "cell" is "on" in the ARRAY PRODUCT TERM, node RBL is physically connected to node PTG which in turn is connected to ground through transistor 108. Under this condition, node RBL takes on a logical "low" voltage of about 1.8 V. This "low" voltage is amplified and translated through inverters 128 and 130 to a full CMOS low level (i.e. Ground) at the output. When RBL is in a static "low" state, the corresponding low level at the output is fed back through inverters 134 and 136 which turns off transistor 112 and turns on transistor 114 which have their gates connected to Node3. In this state, RBL is held low solely through transistor 108 (as mentioned earlier), which is a constant current source with its gate connected to a reference bias voltage VBIAS. With the current path through transistors 114 and 118 to VDD now on, in addition to transistor 116 also connected to VDD which is always biased on, the eventual transition from low to high on the RBL node when all cells in the ARRAY PRODUCT TERM turn off will be quicker.

When all "cells" are "off" in the ARRAY PRODUCT TERM 102, node RBL is physically disconnected from node PTG and is pulled to a "high" voltage of about 2.2 V through transistor 104 by pull-up transistor 116 which is connected to VDD. This "high" voltage is amplified and translated through inverters 128 and 130 to a full CMOS high level (i.e. VDD) at the output. When RBL is in a static "high" state, the corresponding high level at the output is fed back through inverters 134 and 136 which turns off transistor 114 and turns on transistor 112 which have their gates connected to Node3. In this state, RBL is held high solely through transistor 116 (as mentioned earlier), which is a constant current source with its gate connected to a reference bias voltage VSA. With the current path through transistors 106 and 112 to ground now on, in addition to transistor 108 also connected to ground which is always biased on, the eventual transition from high to low on the RBL node when at least one cell in the ARRAY PRODUCT TERM 102 turns on will be quicker.

Figure 1:
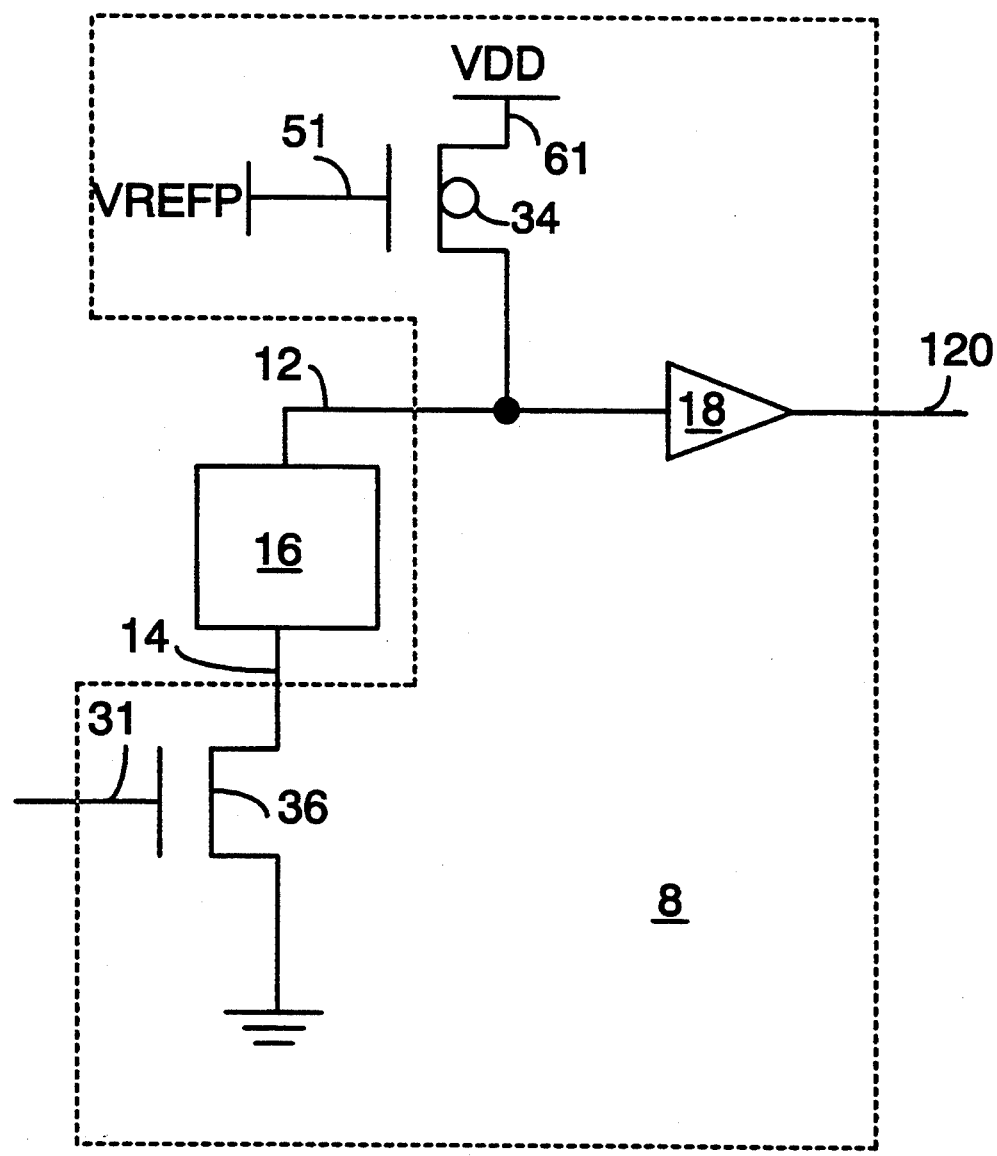
FIG. 1-4 shows diagrams of prior art sense amplifiers.
Figure 2:
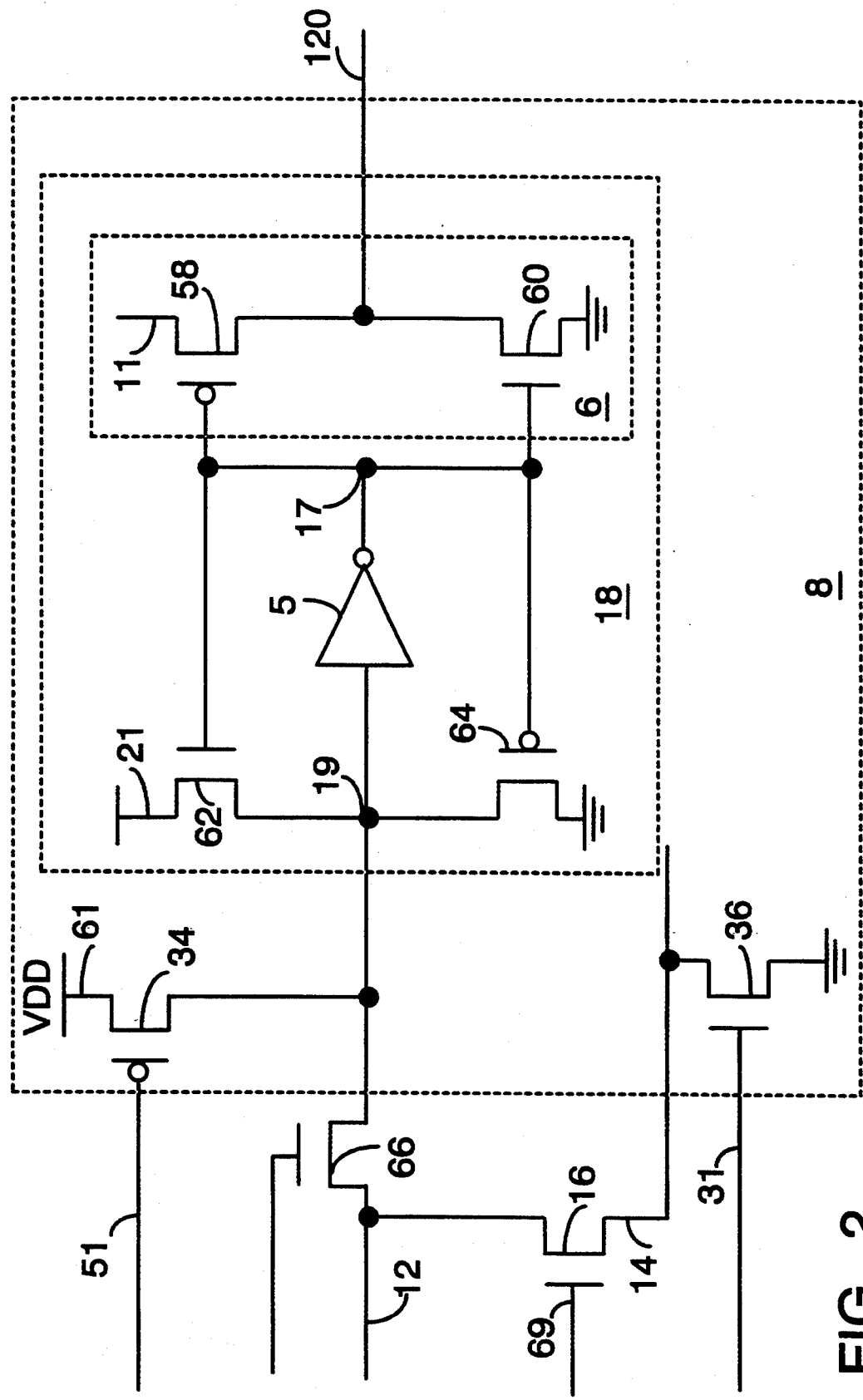
Figure 3:
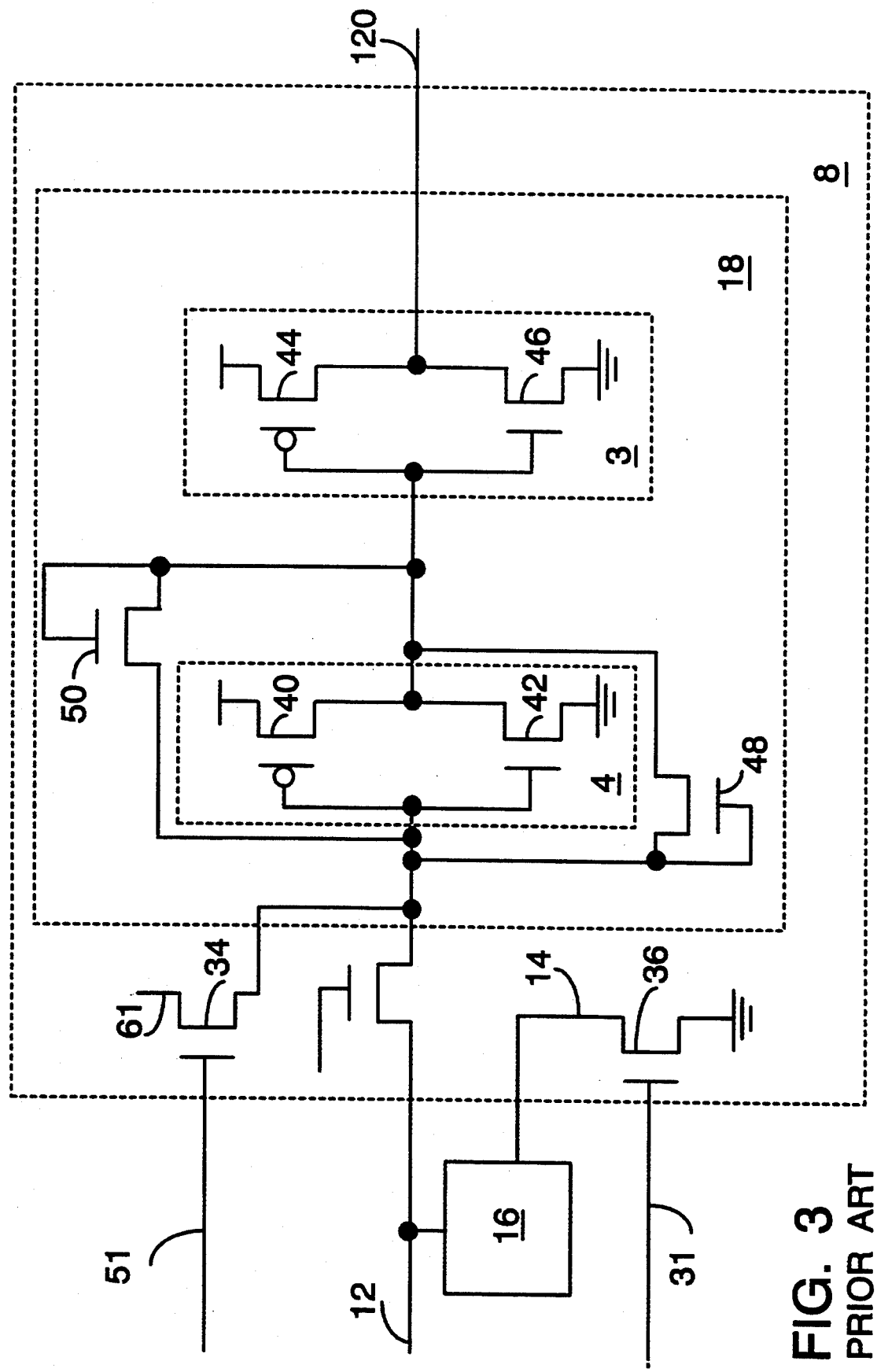
Figure 4:
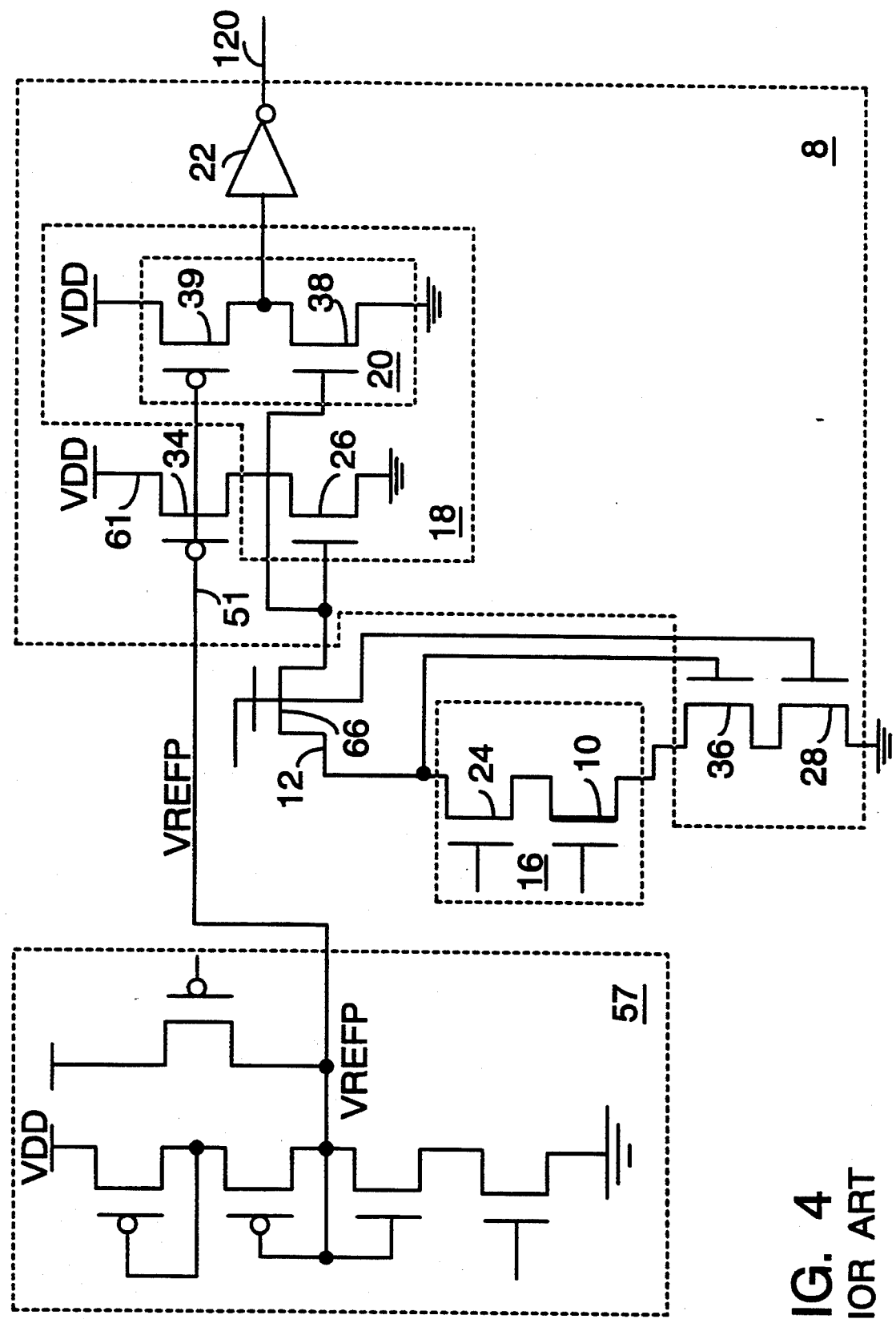
Figure 5A:
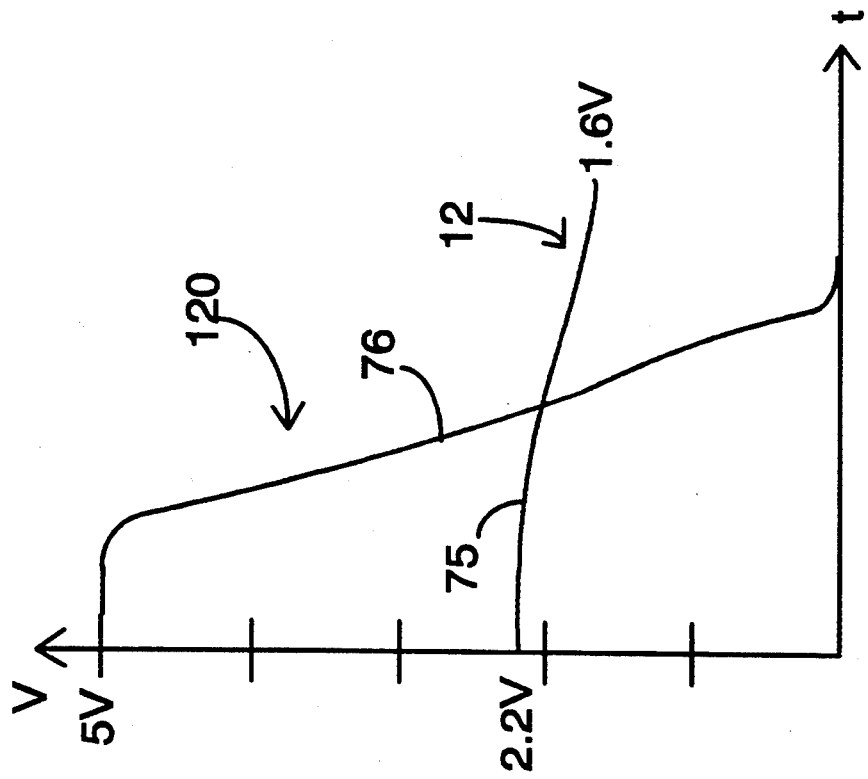
FIGS. 5(a) and (b) diagram a product term PT and an output of prior art sense amplifiers.
Figure 5B:
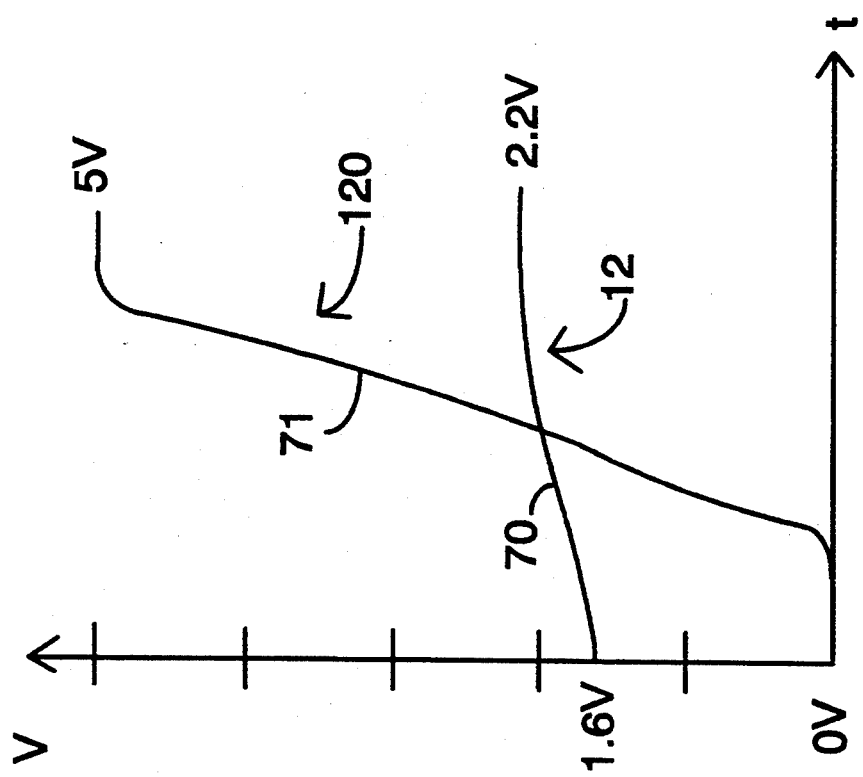
Figure 6B:
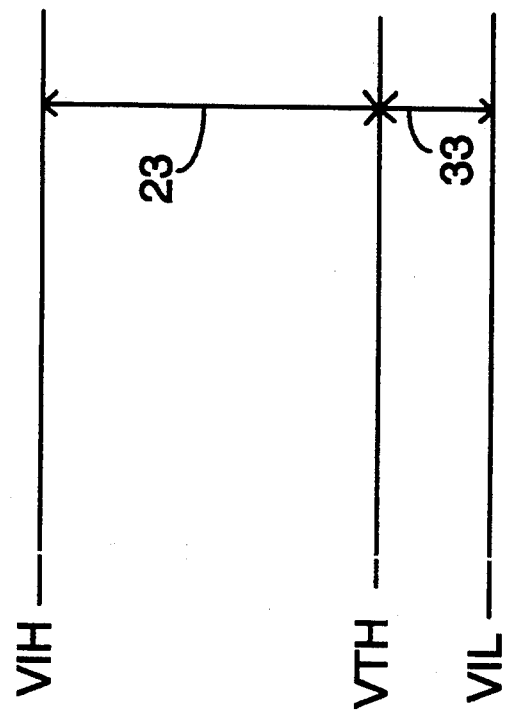
FIG. 6(a) and (b) show a relationship between input and threshold voltages of an amplifier at different temperatures and voltage supplies.
Figure 6A:
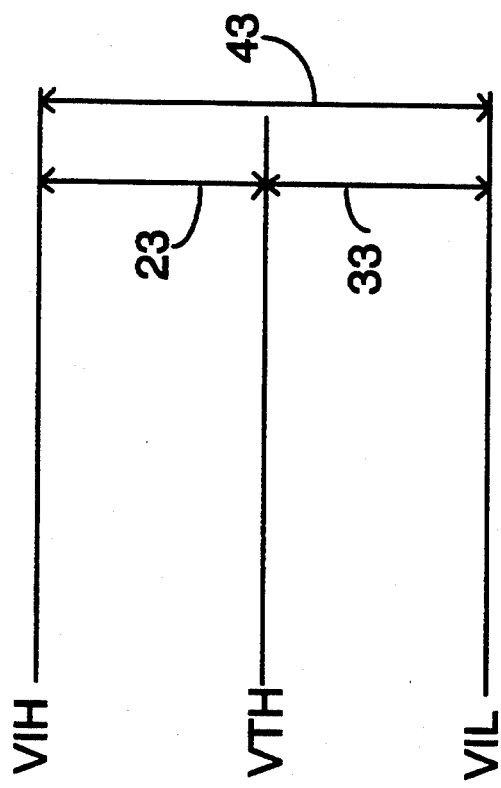
Figure 7:
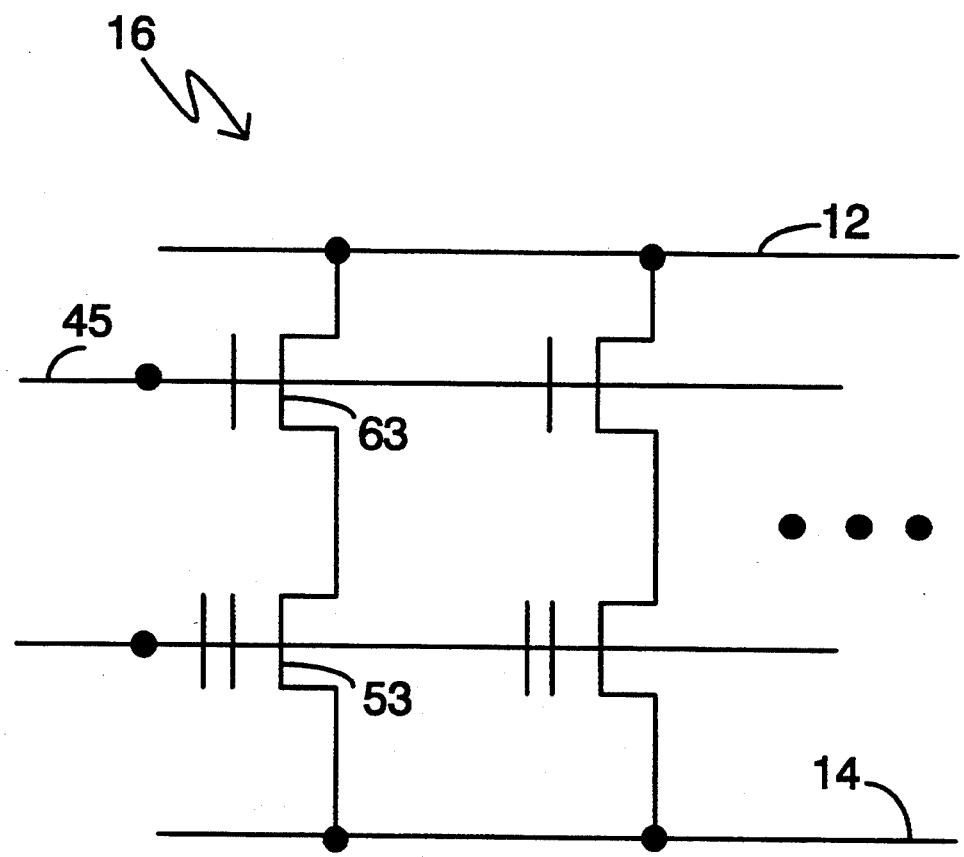
FIG. 7 diagrams a multicell memory whose output goes to a sense amplifier.

Description of the Improvements:

Transistors 120 and 122 function very much like transistors 62 and 64 of Prior Art FIG. 2. In this embodiment, transistors 120 and 122 serve to hold the "high" and "low" voltage levels of the RBL node within a certain window (product term window) with a voltage difference on this node of about 0.4 V to 0.5 V. According to prior art designs, the gates of 120 and 122 would have been connected to Node2 and transistors 124 and 126 would have been omitted. According to the new embodiment, the gates of transistors 120 and 122 are coupled to the output of an additional inverter comprising transistors 124 and 126. There are three advantages to doing this:

1) The speed of the circuit is highly dependent on the edge rates of all the "critical" nodes within the circuit. Edge rate is a function of the current capacity of the switching transistors and the amount of capacitance on that node being switched. Because the goal of this design is to maximize speed while not appreciably affecting power consumption, capacitance on "critical" nodes needs to be reduced in order to speed up the circuit. A critical node for speed is defined as a node that the data traverses in its path from input to output. Therefore, the addition of the inverter comprised of transistors 124 and 126 is now used to drive the gates of transistor 120 and 122 at Node4, not a critical node, thereby reducing the capacitance at Node2, a critical node. The addition of transistor 124 and 126 does add capacitance to Node1, but Node1 already has a significant Capacitive loading due to the ARRAY PRODUCT TERM 102. Therefore, the percentage increase in capacitance on Node1 due to the addition of transistor 124 and 126 is almost insignificant whereas the percentage decrease in capacitance due to the removal of the gates of transistors 120 and 122 from the speed path (i.e. Node 2) is significant. Any added capacitance on Node1 is further minimized because transistor 124 and 126 are made as small as possible provided that they have approximately the same input threshold as inverter 128. It is desirable to make transistor 124 and 126 as small as possible so power consumption is not significantly increased. This can be done because the A.C. speed of Node4 is unimportant to the operation or speed of the circuit.

2) The removal of the gates of transistors 120 and 122 from Node2 allows further action to be taken on Node2 to speed up the circuit in the form of transistor 132 (which will be described later as a preferred embodiment). The gate voltage on transistors 120 and 122 plays a significant role in determining the product term window (PT window). It is critical that the PT window be stable with respect to the input threshold of inverter 128. Any variations in the gate voltage of transistors 120 and 122 not directly related to voltage variations on Node1 are undesirable and may cause oscillations in the circuit. For example, in Prior Art FIG. 2, the gates of transistors 62 and 64 are connected to node 17. Any voltage variation on node 19 will translate over to node 17 and will in turn be compensated for by transistors 62 and 64. This then is a stable circuit because only inverter 5 is driving node 17 and this driving voltage is derived from node 19. With the circuit connected as described above, any attempt to change the voltage characteristics of node 17 with a device not referenced to node 19 (i.e. a transistor with drain connected to node 17 and gate tied to a node other than node 19 or 12) would change/shift the characteristics of the PT window in such a way that would be unstable. Therefore, the preferred embodiment will allow additional speed to be gained at Node2 due to the fact that the gates of transistors 120 and 122 have been removed from Node2.

3) Fine tuning the input threshold of inverter 128 within the PT window is now made simple and straight forward. Changing the input threshold of inverter 128 has no effect on the PT window. With respect to the Prior Art FIG. 2, an attempt to change the input threshold of inverter 5 would tend to cause a shift in the PT window in the same direction thereby negating the threshold adjustment with respect to the PT window. For example, if the input threshold of inverter 5 were increased by 0.2 v, the resulting voltage characteristics of node 17 would tend to shift both the low voltage and the high voltage of node 19 up by about 0.2 v. The effect of this would be an approximate no net change in the input threshold of inverter 5 with respect to its input signal swing. Of course, an adjustment with respect to the PT window could be made but it would require resizing of more than one inverter. It would require resizing inverter 5 along with a combination of transistors 62, 64, 34 and 36. This would be by no means straight forward.

In order to speed up Node2, transistor 132 was added. The purpose of transistor 132 is to speed up the high-to-low transition at Node2 and thus speed up the low-to-high transition at the output of the sense amp. Now that Node2 is independent of the PT window (as described above), the voltage characteristics at this node can be altered to improve the speed. When node2 is low, the output of inverter 130 is high and therefore transistor 132 is not conducting or is considered to be off. When node2 is high, the output of inverter 130 is low and therefore transistor 132 is conducting or is on. This causes Node2 to be pulled down to a lower static high level. Now, when a switch from high-to-low occurs at Node2, the voltage only needs to swing from a lower Voh level down to the input threshold of inverter 130. This reduced voltage swing increases the high-to-low speed at Node2 and thus the low-to-high speed at node PT. The one drawback to doing this is that when Node2 is in a high state, inverter 130 will consume more power as opposed to allowing Node2 to go to a higher level.

The lower the high level of Node2 is set by the size of transistor 132, the faster the high-to-low transition at Node2 will be but more power will be consumed by inverter 130. The converse is also true. Therefore, additional speed is gained at Node2 and PT at the cost of increased power consumption. In order to offset the increased power in this stage, an additional circuit innovation is used to save power in another portion of the circuit (discussed below).

Transistors 114 and 118 provide a feedback path to VDD in order to speed up the low-to-high transition of Node 1. This feedback technique is not new and in fact was used in above identified U.S. Pat. No. 5,189,322. Transistor 118 functions as a current source to regulate the current and transistor 114 essentially functions as an on/off switch depending on the state of PT, the output of the sense amp. If PT is high, transistor 114 is off. If PT is low, transistor 114 is on. In the above identified patent, the gates of transistors 116 and 118 would be connected to the same reference voltage, VSA. Although acceptable, this configuration does not yield optimum power consumption efficiency.

Figure 9:
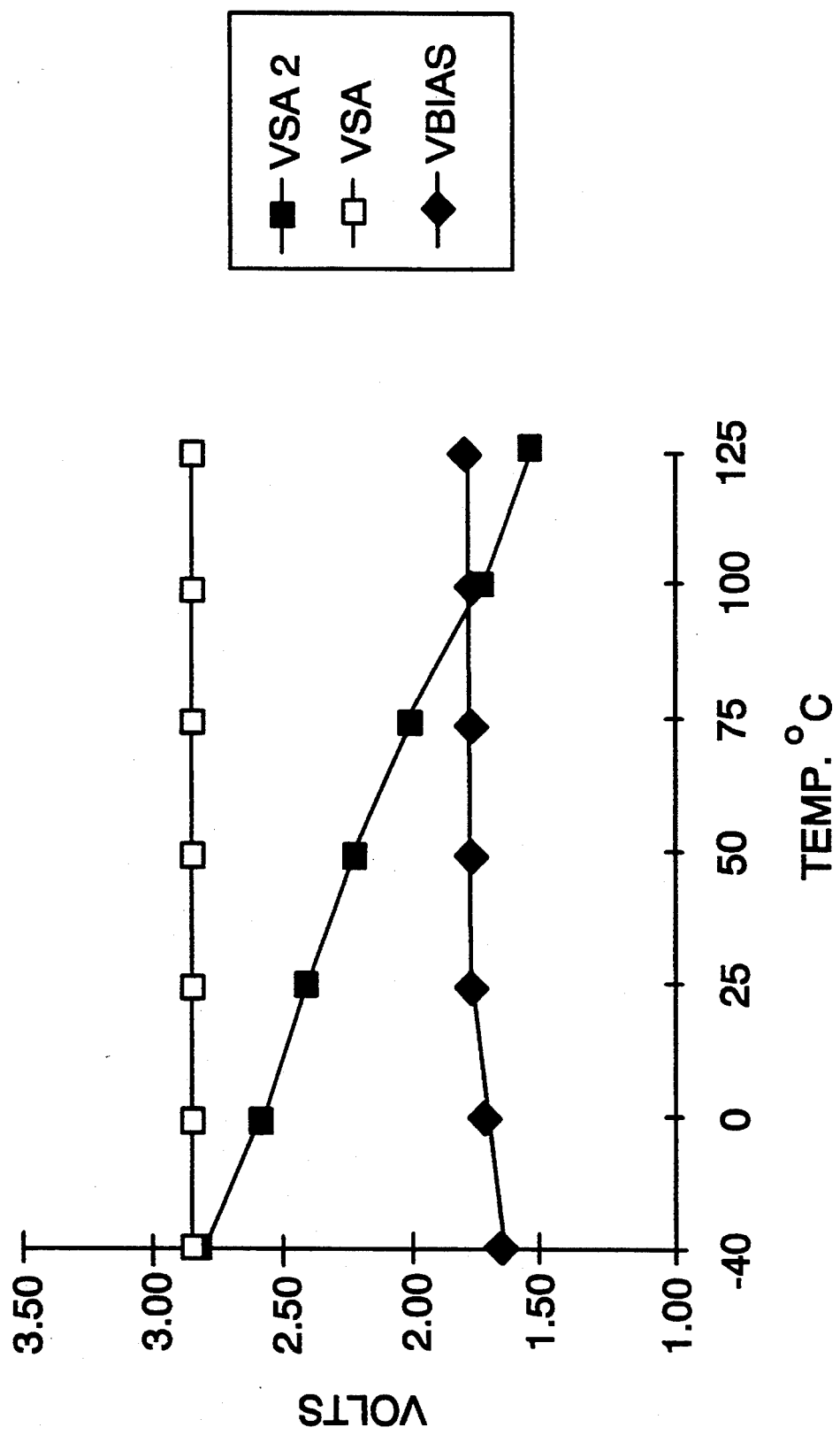
FIG. 9 shows a diagram of a reference voltage versus temperature.

According to the preferred embodiment, the gate of 118 is connected to a new bias voltage source, VSA2 which is utilized to drive the gate of transistor 118. Voltage reference VSA2 has different voltage characteristics with respect to VDD and Temperature as compared to VSA (refer to FIGS. 9 and 10), that make it more optimum as a voltage reference to control the feedback current source (i.e. transistor 118). Typically, the speed of a circuit is the slowest and the power consumption is the lowest at low VDD and hot Temperature (e.g. 4.4 V and 125° C. respectively). Conversely, the speed of a circuit is the fastest and power consumption is the highest at high VDD and low Temperature (e.g. 5.6 V and −40° C. respectively).

The ideal situation would be to balance the two extremes and have the average of speed and power consumption of the two extremes across the entire VDD and Temperature range. This would yield a faster circuit, because it would be faster than the worst case 4.4 V and 125° C. extreme, with lower power consumption, because it would have lower power consumption than the worst case 5.6 V and −40° C. extreme. The approach attempts to get closer to this ideal condition. The now used voltage reference circuit, VSA2, that drives the gate of transistor 118 has the characteristics shown in FIG. 9 and 10.

First, the effect of this new scheme with respect to temperature variations will be examined. At 125° C., where MOS devices slow down due to a decrease in current characteristics at higher temperatures, the voltage of VSA2 is at its lowest point. Because this voltage drives the gate of the PMOS transistor 118 the current and therefore the low-to-high speed of Node1 is maximized under these conditions. At −40° C., where MOS devices speed up due to an increase in current characteristics at lower temperatures, the voltage of VSA2 is at its highest point. Here, the current is minimized and the speed will also be reduced. Under this condition though, it is important to minimize the current because speed is not an issue because all the other transistors get faster.

Figure 10:
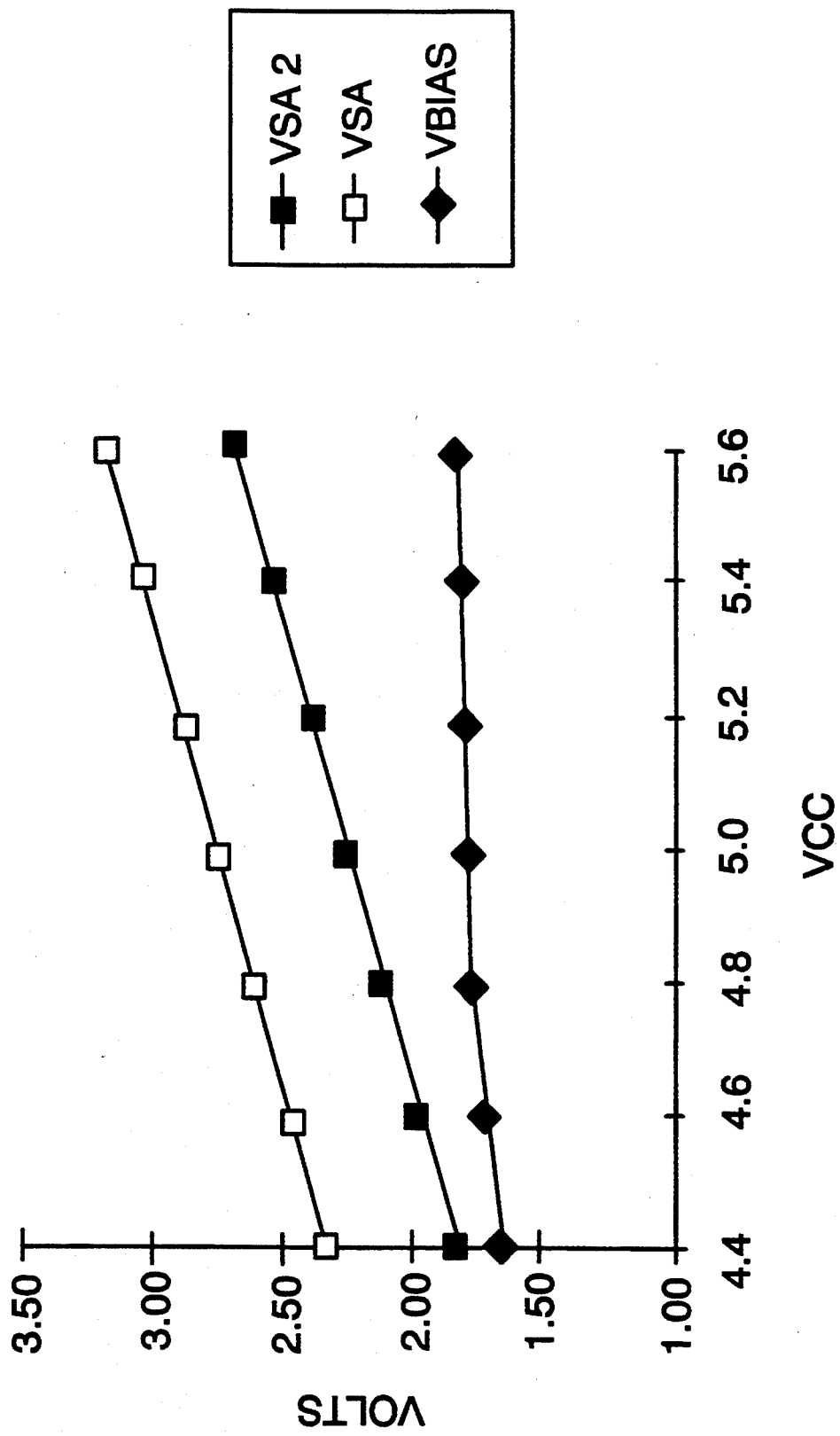
FIG. 10 shows a diagram of a reference voltage versus VDD.

With respect to VDD variations, VSA2 tracks VDD at about a 1:1 ratio as show in FIG. 10. Therefore, at a VDD of 4.4 V, reference voltage VSA2 is at its lowest point and this will tend to maximize the speed and current under this condition. At a VDD of 5.6 V, VSA2 is at it highest point and this will tend to minimize the current and reduce the speed under this condition. The resulting decrease in pull-up current through transistor 118 under high VDD and low Temperature conditions also adds to the circuits noise immunity under conditions when circuit noise tends to be the greatest. This noise immunity comes in the form of an increased PT window which improves the RBL low noise margin.

A typical voltage reference circuit 110 that is capable of providing such characteristics generally makes use of basic current mirroring techniques and typically includes a plurality of transistors and a polysilicon resistor which has a stable temperature coefficient to produce the described characteristics.

Through the embodiments of the present invention, the speed from input to output is significantly improved and the power consumption is kept at a reasonable level. This is achieved along with an improvement in the PT low noise margin through better temperature sensitivity while sensitivity to process variation is not degraded.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A sensing apparatus for receiving an input signal from a cell array and for providing an output signal at an output terminal, the input signal changing level from a first level to a second level and from a second level to a first level, the output signal changing level from a low logic level to a high logic level and from a high logic level to a low logic level, the sensing apparatus including a plurality of critical nodes, the sensing apparatus comprising:
   a first plurality of transistors responsive to the input signal for providing a predetermined difference between voltage levels; and
   a second plurality of transistors coupled at each gate terminal to each source terminal of the first plurality of transistors so as to disconnect the first plurality of transistors from at least one critical node of the sensing apparatus for speeding up the low-to-high and high-to-low transitions of the output signal in response to the transitions in the input signal.

2. The sensing apparatus of claim 1 in which the first plurality of transistors comprises:
   a first n-channel transistor; and
   a first p-channel transistor coupled at a source terminal to a source terminal of the first n-channel transistor.

3. The sensing apparatus of claim 1 wherein the output signal is CMOS compatible.

4. The sensing apparatus of claim 1 which further includes a first logic circuit coupled between the output terminal and a first critical node for speeding up the low-to-high transitions of the output signal.

5. The sensing apparatus of claim 4 in which the first logic circuit comprises a second p-channel transistor, wherein a gate terminal of the second p-channel transistor is coupled to the output terminal and a source terminal of the second p-channel transistor is coupled to the first critical node.

6. The sensing apparatus of claim 4 which further includes a second logic circuit coupled between the output terminal and a second critical node for speeding up the low-to-high transition of the output signal.

7. The sensing apparatus of claim 6 which further includes a voltage reference circuit coupled to the second logic circuit for compensating for temperature variations and to improve noise immunity and minimize power consumption when the output signal is at the low logic level.

8. The sensing apparatus of claim 6 in which the second logic circuit further comprises:
   a third p-channel transistor coupled at a gate terminal to the output terminal and at a drain terminal to the second critical node; and
   a fourth p-channel transistor coupled at a drain terminal to a source terminal of the third p-channel transistor.

9. A sensing apparatus for receiving an input signal from a cell array and for providing an output signal at an output terminal, the input signal changing level from a first level to a second level and from a second level to a first level, the output signal changing level from a low logic level to a high logic level and from a high logic level to a low logic level, the sensing apparatus including a plurality of critical nodes, the sensing apparatus comprising:
   a first plurality of transistors responsive to the input signal for providing a predetermined difference between voltage levels;
   a second plurality of transistors coupled to the first plurality of transistors so as to disconnect the first plurality of transistors from at least one critical node of the sensing apparatus for speeding up the low-to-high and high-to-low transitions of the output signal;
   a first logic circuit coupled between the output terminal and a first critical node for speeding up the low-to-high transitions of the output signal;
   a second logic circuit coupled between the output terminal and a second critical node for speeding up the low-to-high transitions of the output signal; and
   a voltage reference circuit coupled to the second logic circuit for compensating for temperature variations and to improve noise immunity and minimize power consumption when the output signal is at the low logic level.

10. The sensing apparatus of claim 9 wherein the output signal is CMOS compatible.

11. The sensing apparatus of claim 9 in which the first plurality of transistors further comprises:
    a first n-channel transistor; and
    a first p-channel transistor coupled at a source terminal to a source terminal of the first n-channel transistor.

12. The sensing apparatus of claim 11 in which the first logic circuit comprises a second p-channel transistor.

13. The sensing apparatus of claim 11 in which the second logic circuit further comprises:
    a third p-channel transistor coupled at a gate terminal to the output terminal and at a drain terminal to the second critical node; and
    a fourth p-channel transistor coupled at a drain terminal to a source terminal of the third p-channel transistor.

14. An apparatus for sensing whether a first line and a second line are electrically connected to each other and for providing an output signal at an output terminal, the output signal changing level from a low logic level to a high logic level and from a high logic level to a low logic level, the sensing apparatus including at least one critical node, the sensing apparatus comprising:

a first electrical path between the first line and a first voltage;

a second electrical path between the second line and a second voltage;

a first circuit for opening and closing the first electrical path in response to a voltage on the first line;

a second circuit for opening and closing the second electrical path in response to the voltage on the second line;

a first plurality of transistors coupled to the first path for holding the voltage on the first line within a predetermined difference between voltage levels; and a second plurality of transistors coupled in series with the first line and coupled at each gate terminal to each source terminal of the first plurality of transistors so as to disconnect the first plurality of transistors from at least one critical node of the sensing apparatus for speeding up the low-to-high and high-to-low transitions of the output signal.

15. The sensing apparatus of claim 14 in which the first plurality of transistors comprises:

a first n-channel transistor; and a first p-channel transistor coupled at a source terminal to a source terminal of the first n-channel transistor.

16. The sensing apparatus of claim 14 wherein the output signal is CMOS compatible.

17. The sensing apparatus of claim 14 which further includes a first logic circuit coupled between the output terminal and a first critical node for speeding up the low-to-high transitions of the output signal.

18. The sensing apparatus of claim 17 in which the first logic circuit comprises a second p-channel transistor.

19. The sensing apparatus of claim 17 which further includes a second logic circuit coupled between the output terminal and a second critical node for speeding up the low-to-high transitions of the output signal.

20. The sensing apparatus of claim 19 which further includes voltage reference circuit coupled to the second logic circuit for compensating for temperature variations to improve noise immunity and minimize power consumption when the output signal is at the low logic level.

21. The sensing apparatus of claim 19 in which the second logic circuit further comprises:

a third p-channel transistor coupled at a gate terminal to the output terminal and at a drain terminal to the second critical node; and a fourth p-channel transistor coupled at a drain terminal to a source terminal of the third p-channel transistor.

22. An apparatus for sensing whether a first line and a second line are electrically connected to each other and for providing an output signal which is CMOS compatible at an output terminal, the output signal changing level from a low logic level to a high logic level and from a high logic level to a low logic level, the sensing apparatus including at least one critical node, the sensing apparatus comprising:

a first electrical path between the first line and a first voltage;

a second electrical path between the second line and a second voltage;

a first circuit for opening and closing the first electrical path in response to a voltage on the first line;

a second circuit for opening and closing the second electrical path in response to the voltage on the second line;

a first plurality of transistors coupled to the first path for holding the voltage on the first line within a predetermined difference between voltage levels, the first plurality of transistors comprising:

a first n-channel transistor, and a first p-channel transistor coupled at a source terminal to a source terminal of the first n-channel transistor;

a second plurality of transistors coupled in series with the first line and coupled to the first plurality of transistors so as to disconnect the first plurality of transistors from a critical node of the sensing apparatus for speeding up the low-to-high and high-to-low transitions of the output signal;

a first logic circuit coupled between the output terminal and a first critical node for speeding up the low-to-high transitions of the output signal, the first logic circuit comprising a second p-channel transistor;

a second logic circuit coupled between the output terminal and a second critical node for speeding up the low-to-high transitions of the output signal, the second logic circuit comprising:

a third p-channel transistor coupled at a gate terminal to the output terminal and at a drain terminal to the second critical node, and a fourth p-channel transistor coupled at a drain terminal to a source terminal of the third p-channel transistor; and a voltage reference circuit coupled to the second logic circuit for compensating for temperature variations and to improve noise immunity and minimize power consumption when the output signal is at the low logic level.

* * * * *